United States Patent
Chen et al.

(10) Patent No.: US 6,781,147 B2
(45) Date of Patent: Aug. 24, 2004

(54) LATERAL CURRENT BLOCKING LIGHT EMITTING DIODE AND METHOD OF MAKING THE SAME

(75) Inventors: Shi-Ming Chen, Tainan (TW); Chun-Liang Lin, Tainan (TW); Wen-Bin Chen, Changhua (TW); Yan-Kuin Su, Tainan (TW)

(73) Assignee: Epitech Corporation, Ltd., Hsinshi (TW)

( * ) Notice: Subject to any disclaimer, the term of this patent is extended or adjusted under 35 U.S.C. 154(b) by 0 days.

(21) Appl. No.: 10/340,137

(22) Filed: Jan. 10, 2003

(65) Prior Publication Data

US 2004/0089861 A1 May 13, 2004

(30) Foreign Application Priority Data

Nov. 12, 2002 (TW) ..................................... 91133203 A

(51) Int. Cl.[7] .......................... H01L 29/06; H01L 29/12
(52) U.S. Cl. ............................ 257/11; 257/12; 257/21; 257/94; 257/184; 257/431; 257/432
(58) Field of Search .............................. 257/11, 12, 21, 257/94, 184, 431–432

(56) References Cited

U.S. PATENT DOCUMENTS

| | | | | |
|---|---|---|---|---|
| 5,311,533 A | * | 5/1994 | Stutius et al. .................. | 372/46 |
| 5,404,373 A | * | 4/1995 | Cheng .......................... | 372/50 |
| 5,422,904 A | * | 6/1995 | Gorfinkel et al. ............. | 372/50 |
| 5,455,451 A | * | 10/1995 | Usagawa et al. ........... | 257/661 |
| 5,612,231 A | * | 3/1997 | Holm et al. ................... | 438/23 |
| 5,650,641 A | * | 7/1997 | Sassa et al. .................... | 257/88 |
| 5,757,836 A | * | 5/1998 | Jiang et al. .................... | 372/50 |
| 5,798,535 A | * | 8/1998 | Huang et al. ................. | 257/83 |
| 5,821,571 A | * | 10/1998 | Lebby et al. ................. | 257/98 |
| 6,134,368 A | * | 10/2000 | Sakata ......................... | 385/131 |
| 6,287,884 B1 | * | 9/2001 | Jie et al. ...................... | 438/39 |
| 6,445,007 B1 | * | 9/2002 | Wu et al. ..................... | 257/80 |
| 6,468,824 B2 | * | 10/2002 | Chen et al. ................... | 438/46 |
| 6,542,525 B1 | * | 4/2003 | Matsumoto et al. .......... | 372/26 |
| 2002/0055218 A1 | * | 5/2002 | Chiou et al. ................ | 438/222 |
| 2002/0109149 A1 | * | 8/2002 | Chang ......................... | 257/98 |

FOREIGN PATENT DOCUMENTS

JP        07226565 A   *  8/1995   ............. H01S/3/18

* cited by examiner

*Primary Examiner*—Amir Zarabian
*Assistant Examiner*—Ida M. Soward
(74) *Attorney, Agent, or Firm*—Harness, Dickey & Pierce, P.L.C.

(57) ABSTRACT

A lateral current blocking light emitting diode (LED) and a method of making the same are disclosed. The present invention features in that a trench is formed between the two electrodes via the technique of such as etching, wherein the depth of the trench reaches to at least the active layer, thereby blocking the lateral current between the two electrodes. With the use of the present invention, the possibility of the current passing through the active layer can be increased, thereby improving the brightness of the LED; and the chance of the photons emitted from the lateral of the trench can be raised wherein the photons are generated from the active layer, thereby increasing the output efficiency of the photons generated from the active layer.

10 Claims, 5 Drawing Sheets

LATERAL CURRENT BLOCKING LIGHT EMITTING DIODE AND METHOD OF MAKING THE SAME

FIELD OF THE INVENTION

The present invention relates to a structure of light emitting diode (LED) and a method of making the same, and more particularly, to a structure of lateral current blocking LED and a method of making the same.

BACKGROUND OF THE INVENTION

In recent years, a great deal of attention has been directed to the light-emitting device utilizing gallium nitride-based semiconductors such as GaN, AlGaN, InGaN, and AlInGaN. Usually, most of the light-emitting devices of the aforementioned type are grown on an electrically insulating sapphire substrate, which is different from other light-emitting devices utilizing conductive substrates. Since the sapphire substrate is an insulator, the electrodes cannot be directly formed on the substrate, and has to directly contact the P-type semiconductor layer and the N-type semiconductor layer individually so as to complete the manufacturing of the light-emitting device formed on the sapphire substrate.

Please refer to FIG. 1A showing the cross section viewed along the a–a' line in FIG. 1B and FIG. 1B showing the top view of the conventional nitride LED. The structure shown in FIG. 1A and FIG. 1B can be formed via the following steps. Firstly, a buffer layer 20 is epitaxially grown on a substrate 10, wherein the material of the substrate 10 is such as sapphire; and the material of the buffer layer 20 is such as AlN or GaN. Then, a semiconductor layer 30 of a first polarity (made of material such as $(Al_xGa_{1-x})_yIn_{1-y}N$ ($0 \leq x \leq 1; 0 \leq y \leq 1$)), a cladding layer 40 of the first polarity (made of material such as $(Al_xGa_{1-x})_yIn_{1-y}N$ ($0 \leq x \leq 1; 0 \leq y \leq 1$)), an active layer 50 that has double heterostructure or quantum well and comprises $(Al_xGa_{1-x})_yIn_{1-y}N$ ($0 \leq x \leq 1; 0 \leq y \leq 1$), a cladding layer 60 of a second polarity (made of material such as $(Al_xGa_{1-x})_yIn_{1-y}N$ ($0 \leq x \leq 1; 0 \leq y \leq 1$)), and a highly doped contact layer 70 of the second polarity (made of material such as $(Al_xGa_{1-x})_yIn_{1-y}N$ ($0 \leq x \leq 1; 0 \leq y \leq 1$)) are sequentially epitaxially grown on the buffer layer 20.

Afterwards, the aforementioned epitaxial layers are etched or polished via dry etching, wet etching, or mechanical cutting and polishing, thereby exposing a portion of the semiconductor layer 30 of the first polarity. Then, a metal electrode pad 90 of the first polarity is deposited on the exposed portion of the semiconductor layer 30 of the first polarity via thermal evaporation, e-beam evaporation, or sputtering, etc.; and a transparent electrode 100a of the second polarity and a metal electrode pad 100b of the second polarity are sequentially deposited on the contact layer 70 of the second polarity.

Although the transparent electrode 100a of the second polarity of the aforementioned structure can enhance the effect of current spreading, but in fact, most of the current still flows along the line between the transparent electrode 100a of the second polarity and the metal electrode pad 90 of the first polarity, causing no current flowing through most of the active layer 50, so that the light emitting efficiency of LED is not high (the light emitting region being mostly concentrated between the transparent electrode 100a of the second polarity and the metal electrode pad 90 of the first polarity), and the life of LED is reduced (due to the current overly concentrated causing temperature too high in local region). Although the thickness of the transparent electrode 100a of the second polarity can be increased so as to improve the effect of current spreading, yet the transparency of the transparent electrode 100a of the second polarity is reduced consequently.

Moreover, if the photon generated by the active layer 50 is emitted to the surface of LED at a large angle, the loss of total reflection will occur easily, so that only the photon emitted at a large angle from the neighborhood of the lateral of LED can be emitted outward more easily from LED.

Therefore, there are many relevant patents about the aforementioned conventional techniques. For example, Toshiba addressed a method of re-growth to confine the current (U.S. Pat. Nos. 5,732,098/6,229,893), wherein an insulating layer is deposited in the semiconductor element so as to achieve the effect of confining the current vertically. However, the aforementioned steps are complicated, so that the cost is increased. LumiLeds utilized the etching of p metal electrode to increase the current distribution and the light emitting efficiency, thereby achieving the high light emitting effect (U.S. Pat. Nos. 6,291,839/6,287,947/6,258, 618). However, the depth of etching is not enough, so that the current transmission path cannot be assured definitely. Boston University of U.S. addressed that the photonic crystal can be applied in LED (U.S. Pat. No. 5,955,749), but the disadvantage therein is that the depth of etching is too deep and the production thereof is difficult.

SUMMARY OF THE INVENTION

Just as described above, there are disadvantages about the conventional nitride LED. Therefore, an objective of the present invention is to provide a lateral current blocking LED and a method of making the same, wherein the etching of the trench used to block the lateral current can be performed simultaneously with the process of exposing the semiconductor layer of the first polarity (in order to make the metal electrode pad of the first polarity), so that the production cost is not increased.

Another objective of the present invention is to provide a lateral current blocking LED and a method of making the same, wherein the trench is located between the two metal electrodes for increasing the possibility of the current passing through the active layer (the light emitting region), and the brightness of the LED.

Still another objective of the present invention is to provide a lateral current blocking LED and a method of making the same, and the trench thereof can be used to provide the chance of the photons emitted from the lateral of the trench, wherein the photons are generated from the active region at the central region of the element, especially for enabling some photons that originally would be totally reflected to be emitted out from the lateral of the trench via the trench, thereby increasing the output efficiency of the photons generated from the active layer.

According to the aforementioned objectives of the present invention, the present invention provides a lateral current blocking LED comprising: a substrate; a semiconductor layer of a first polarity, wherein the semiconductor layer of the first polarity is located on the substrate; a semiconductor epitaxial structure, wherein the semiconductor epitaxial structure is located on one portion of the semiconductor layer of the first polarity, and comprises an active layer, the semiconductor epitaxial structure comprising at least one trench, wherein the depth of the at least one trench reaches to at least the active layer; a metal electrode pad of the first polarity, wherein the metal electrode pad of the first polarity is located on the other portion of the semiconductor layer of the first polarity; and a metal electrode pad of a second polarity, wherein the metal electrode pad of the second polarity is located on the semiconductor epitaxial structure, and the metal electrode pad of the first polarity and the metal electrode pad of the second polarity are located at two opposite sides of the at least one trench.

According to the aforementioned objectives of the present invention, the present invention further provides a method of making a lateral current blocking LED, the method comprising the following steps: firstly, providing a substrate; then, forming a semiconductor layer of a first polarity on the substrate; then, forming a semiconductor epitaxial structure on the semiconductor layer of the first polarity; then, removing a first portion of the semiconductor epitaxial structure, thereby exposing one portion of the semiconductor layer of the first polarity; then, removing a second portion of the semiconductor epitaxial structure, thereby forming at least one trench in the semiconductor epitaxial structure, wherein the semiconductor epitaxial structure comprises an active layer, and the depth of the at least one trench reaches to at least the active layer; afterwards, forming respectively a metal electrode pad of the first polarity and a metal electrode pad of the second polarity on the exposed portion of the semiconductor layer of the first polarity and a third portion of the semiconductor epitaxial structure, wherein the metal electrode pad of the first polarity and the metal electrode pad of the second polarity are located at two opposite sides of the at least one trench.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Since the conventional structure of III-nitride LED has many disadvantages, hence the present invention provides a simple method of making the nitride LED, thereby overcoming the disadvantages resulted from the conventional structure. However, the applicable scope of the present invention comprises the LED in which the positive and negative electrodes are located on the same side of the substrate, and is not limited to the nitride LED.

Figure 1A:
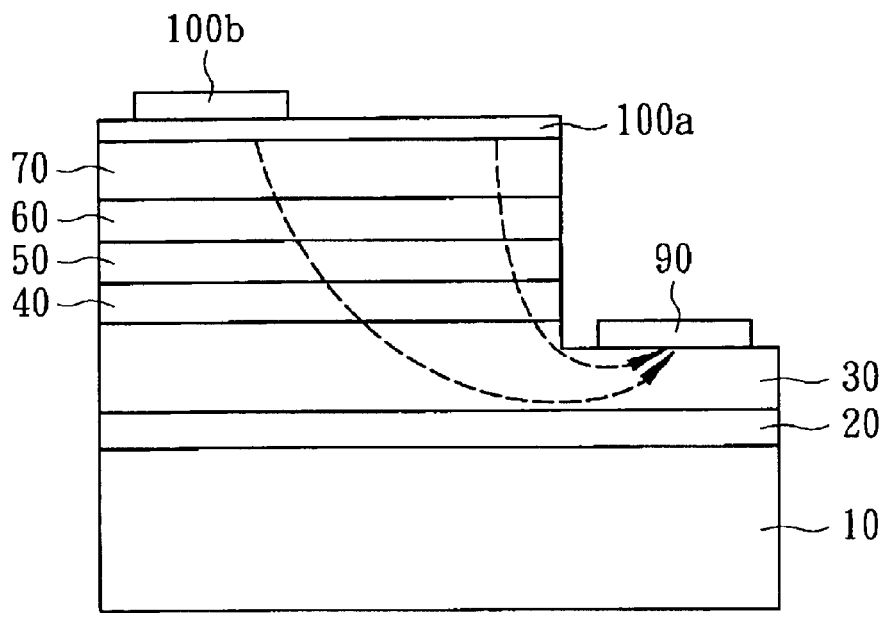
FIG. 1A is a diagram showing the cross section viewed along the a–a' line in FIG. 1B.
Figure 1B:
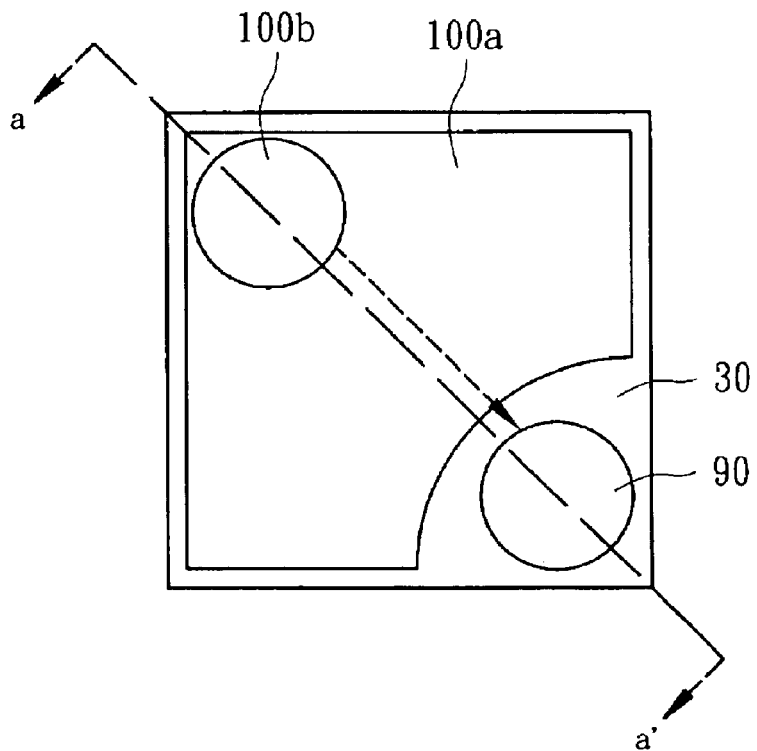
FIG. 1B is a diagram showing the top view of the conventional nitride LED.
Figure 2A:
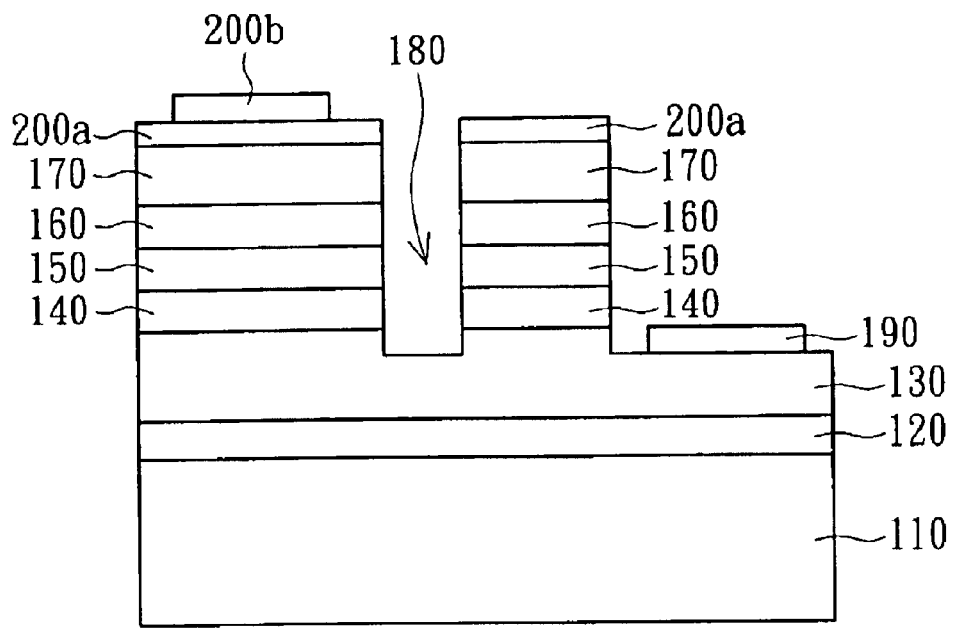
FIG. 2A is a diagram showing the cross section viewed along the b–b' line in FIG. 2B.
Figure 2B:
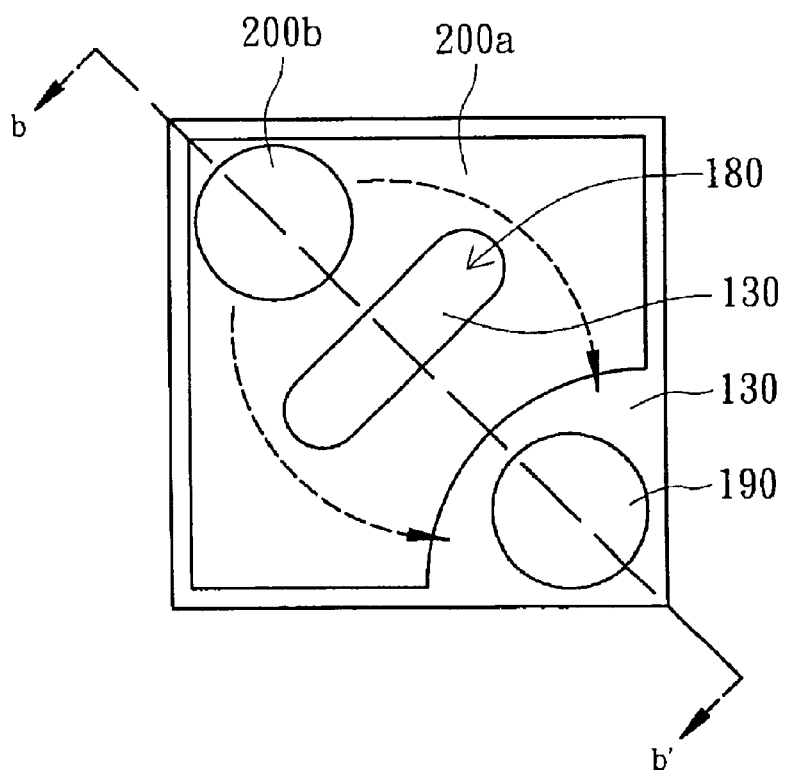
FIG. 2B is a diagram showing the top view of the lateral current blocking nitride LED according to an embodiment of the present invention.

Please refer to FIG. 2A showing the cross section viewed along the b–b' line in FIG. 2B and FIG. 2B showing the top view of the conventional nitride LED. The structure shown in FIG. 2A and FIG. 2B can be formed via the following steps. Firstly, a buffer layer 120 of low temperature is epitaxially grown on a substrate 110, wherein the material of the substrate 110 is such as sapphire, and the material of the buffer layer 120 is such as AlN or GaN. Then, a semiconductor layer 130 of a first polarity (made of material such as $(Al_xGa_{1-x})_yIn_{1-y}N(0 \leq x \leq 1; 0 \leq y \leq 1)$), a cladding layer 140 of the first polarity (made of material such as $(Al_xGa_{1-x})_y In_{1-y}N(0 \leq x \leq 1; 0 \leq y \leq 1)$), an active layer 150 that has double heterostructure or quantum well and comprises $(Al_xGa_{1-x})_yIn_{1-y}N(0 \leq x \leq 1; 0 \leq y \leq 1)$, a cladding layer 160 of a second polarity (made of material such as $(Al_xGa_{1-x})_yIn_{1-y}N(0 \leq x < 1; 0 \leq y \leq 1)$), and a highly doped contact layer 170 of the second polarity (made of material such as $(Al_xGa_{1-x})_y In_{1-y}N(0 \leq x \leq 1; 0 \leq y \leq 1)$) are sequentially epitaxially grown on the buffer layer 120. The first polarity mentioned above can be either positive or negative, and the second polarity is different from the first polarity.

After the aforementioned epitaxial structure is completed, the epitaxial structure can be etched or polished via dry etching, wet etching, or mechanical cutting and polishing, thereby exposing a portion of the semiconductor layer 130 of a first polarity and forming a trench 180 between the two electrodes (that is, downward from the contact layer 170 of the second polarity), wherein the trench 180 is used to block the lateral current, thereby increasing the possibility of the current passing through the active layer 150 and hence raising the brightness. The trench 180 can be formed simultaneously with the process of exposing the semiconductor layer 130 of a first polarity (in order to make a metal electrode pad 190 of the first polarity) via dry or wet etching, so that the production cost is not increased. Or, the trench 180 can be also formed via laser, water jet, or mechanical drilling, etc.

The depth of the aforementioned trench 180 has to reach to at least the active layer 150, and the number of the trench 180 can be greater than or equal to one. Furthermore, the at least one trench 180 can be arranged in a way of individual arrangement, side by side arrangement, or staggering arrangement. In addition, as shown in the top view of FIG. 2B, the shape of the trench 180 is not limited thereto, and hence can be circle, square, or ellipse, etc. Besides, the insulating dielectric material can be further filled in the trench 180, thereby reducing the accident of short-circuiting. Furthermore, the trench 180 can be used to provide the chance of the photons emitted from the lateral of the trench 180, wherein the photons are generated from the active layer 150, especially for enabling some photons that originally would be totally reflected to be emitted out from the lateral of the trench 180 via the trench 180.

Afterwards, a metal electrode pad 190 of the first polarity is deposited on the exposed portion of the semiconductor layer 130 of the first polarity via thermal evaporation, e-beam evaporation, or sputtering, etc.; and a transparent electrode 200a of the second polarity and a metal electrode pad 200b of the second polarity are sequentially deposited on the contact layer 170 of the second polarity.

Figure 3A:
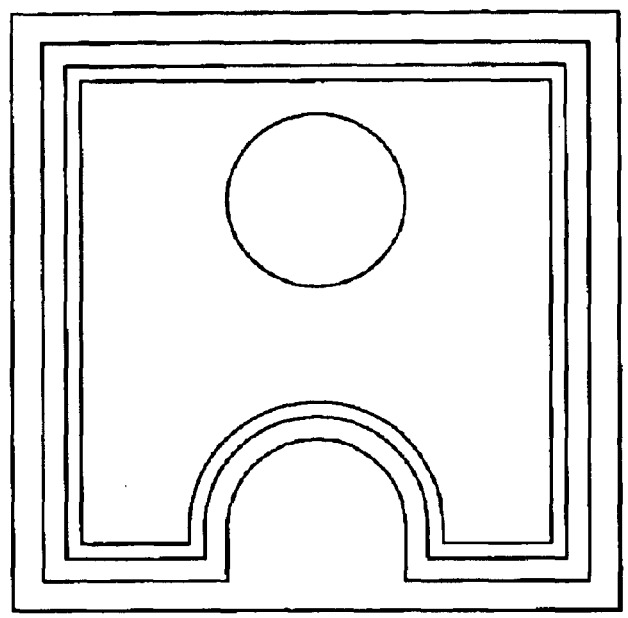
FIG. 3A is a diagram showing the top view of the epitaxial structure of a conventional InGaN LED after the electrode is made.
Figure 3B:
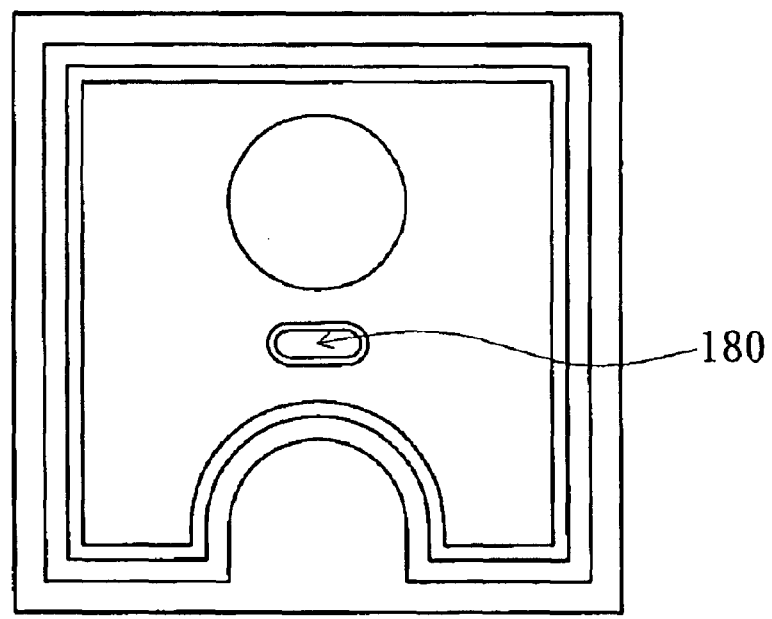
FIG. 3B is a diagram showing the top view of the epitaxial structure shown in FIG. 3A after the trench etching process according to the present invention is performed, wherein the relative intensity of the optical output is increased from original 20.3 to 21.52 (6.0% increase) under the condition that the current is 20 mA and the forward voltage $V_f$ is 3.5V.

Please refer to FIG. 3A and FIG. 3B. FIG. 3A is a diagram showing the top view of the epitaxial structure of a conventional InGaN LED after the electrode is made. FIG. 3B is a diagram showing the top view of the epitaxial structure shown in FIG. 3A after the trench 180 etching process according to the present invention is performed. The relative intensity of the optical output is increased from original 20.3 to 21.52 (6.0% increase) under the condition that the current is 20 mA and the forward voltage $V_f$ is 3.5V.

Figure 4A:
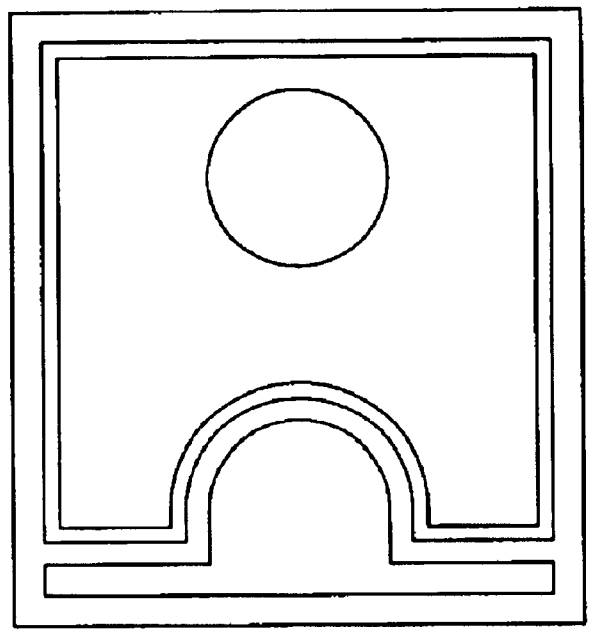
FIG. 4A is a diagram showing the top view of the epitaxial structure of another conventional InGaN LED after the electrode is made.
Figure 4B:
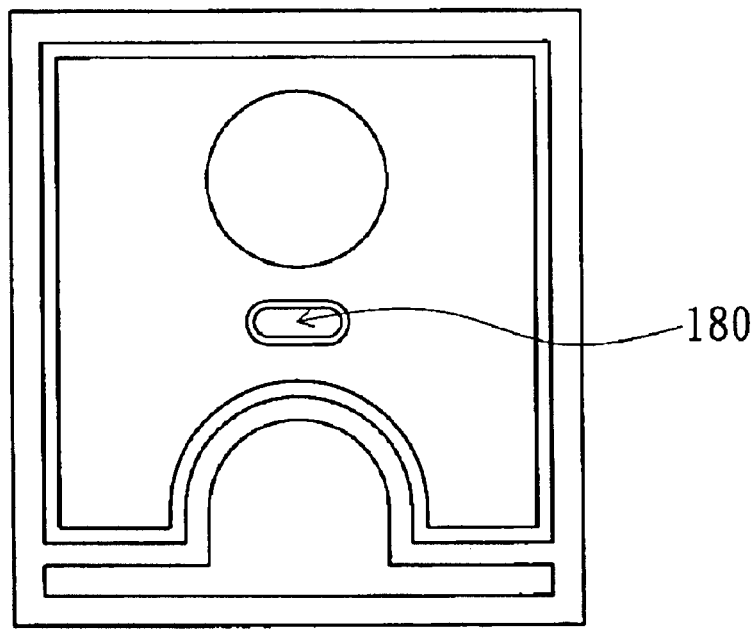
FIG. 4B is a diagram showing the top view of the epitaxial structure shown in FIG. 4A after the trench etching process according to the present invention is performed, wherein the relative intensity of the optical output is increased from original 24.0 to 24.4 (1.7% increase) under the condition that the current is 20 mA and the forward voltage $V_f$ is 3.5V.

Please refer to FIG. 4A and FIG. 4B. FIG. 4A is a diagram showing the top view of the epitaxial structure of another conventional InGaN LED after the electrode is made. FIG. 4B is a diagram showing the top view of the epitaxial structure shown in FIG. 4A after the trench 180 etching process according to the present invention is performed. The relative intensity of the optical output is increased from original 24.0 to 24.4 (1.7% increase) under the condition that the current is 20 mA and the forward voltage $V_f$ is 3.5V.

Figure 5A:
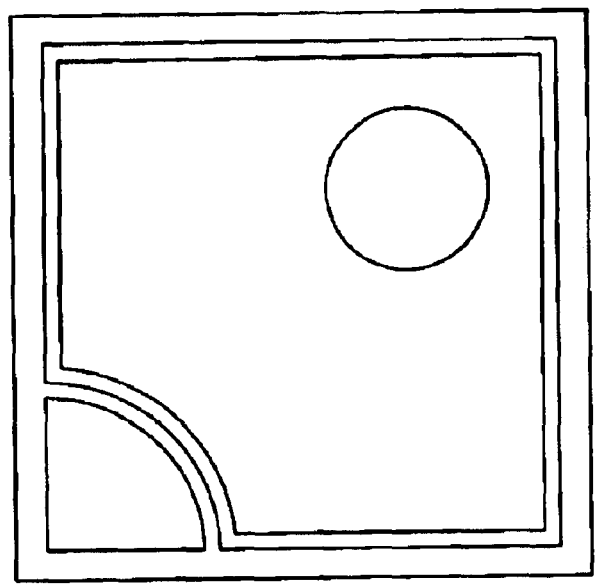
FIG. 5A is a diagram showing the top view of the epitaxial structure of still another conventional InGaN LED after the electrode is made.
Figure 5B:
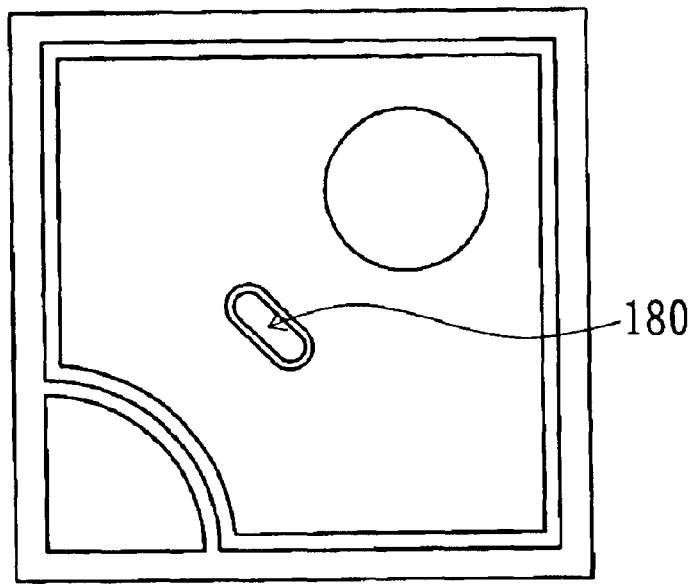
FIG. 5B is a diagram showing the top view of the epitaxial structure shown in FIG. 5A after the trench etching process according to the present invention is performed, wherein the relative intensity of the optical output is increased from original 24.5 to 25.5 (4.1% increase) under the condition that the current is 20 mA and the forward voltage $V_f$ is 3.5V.

Please refer to FIG. 5A and FIG. 5B. FIG. 5A is a diagram showing the top view of the epitaxial structure of still another conventional InGaN LED after the electrode is made. FIG. 5B is a diagram showing the top view of the epitaxial structure shown in FIG. 5A after the trench 180 etching process according to the present invention is performed. The relative intensity of the optical output is increased from original 24.5 to 25.5 (4.1% increase) under the condition that the current is 20 mA and the forward voltage $V_f$ is 3.5V.

To sum up, an advantage of the present invention is to provide a lateral current blocking LED and a method of making the same, wherein the etching of the trench used to block the lateral current can be performed simultaneously with the process of exposing the semiconductor layer of the first polarity (in order to make the metal electrode pad of the first polarity), so that the production cost does not increase.

Another advantage of the present invention is to provide a lateral current blocking LED and a method of making the same, wherein the trench is located between the two metal electrodes, thereby increasing the possibility of the current passing through the active layer (the light emitting region), so that the brightness of the LED is increased.

Still another advantage of the present invention is to provide a lateral current blocking LED and a method of making the same, wherein the trench can be used to provide the chance of the photons emitted from the lateral of the trench, wherein the photons are generated from the active region at the central region of the element. Especially, some photons that originally would be totally reflected can be emitted out from the lateral of the trench via the trench, thereby increasing the output efficiency of the photons generated from the active layer.

As is understood by a person skilled in the art, the foregoing preferred embodiments of the present invention are illustrations of the present invention rather than limitations of the present invention. It is intended to cover various modifications and similar arrangements comprised within the spirit and scope of the appended claims, the scope of which should be accorded the broadest interpretation so as to encompass all such modifications and similar structure.

What is claimed is:

1. A lateral current blocking light emitting diode (LED), comprising:
    a substrate;
    a semiconductor layer of a first polarity, wherein the semiconductor layer of the first polarity is located on the substrate and comprises first and second portions;
    a semiconductor epitaxial structure, wherein the semiconductor epitaxial structure is located entirely on the first portion of the semiconductor layer of the first polarity, and the semiconductor epitaxial structure comprises an active layer, wherein the semiconductor epitaxial structure comprises at least one trench, and a depth of the at least one trench reaches to at least the active layer;
    a metal electrode pad of the first polarity, wherein the metal electrode pad of the first polarity is located on the second portion of the semiconductor layer of the first polarity; and
    a metal electrode pad of a second polarity, wherein the second polarity is different from the first polarity, the metal electrode pad of the second polarity is located on the semiconductor epitaxial structure, the metal electrode pad of the first polarity and the metal electrode pad of the second polarity are located at two opposite sides of the at least one trench separated by the at least one trench, and the at least one trench provides a blocking of lateral current flowing between the metal electrode pad of the first polarity and the metal electrode pad of the second polarity.

2. The lateral current blocking LED according to claim 1, wherein the substrate is made of sapphire.

3. The lateral current blocking LED according to claim 1, wherein the semiconductor layer of the first polarity and the active layer are made of $(Al_xGa_{1-x})_yIn_{1-y}N\_(0 \leq x \leq 1;\_ 0 \leq y \leq 1))$.

4. The lateral current blocking LED according to claim 1, wherein the active layer has a structure of double heterostructure or quantum well.

5. The lateral current blocking LED according to claim 1, wherein the at least one trench is arranged in a way of individual arrangement, side-by-side arrangement, or staggering arrangement.

6. The lateral current blocking LED according to claim 1, wherein the shape of the at least one trench on a surface of the semiconductor epitaxial structure is circle, square, or ellipse.

7. The lateral current blocking LED according to claim 1, wherein the at least one trench is formed by dry etching, wet etching, laser, water jet, or mechanical drilling.

8. The lateral current blocking LED according to claim 1, wherein a dielectric material is further formed in the at least one trench.

9. The lateral current blocking LED according to claim 1, wherein the semiconductor epitaxial structure comprises a stacked structure composed of a cladding layer of the first polarity, the active layer, a cladding layer of the second polarity, a contact layer of the second polarity, and a transparent electrode of the second polarity.

10. The lateral current blocking LED according to claim 1, wherein a buffer layer is further formed between the substrate and the semiconductor layer of the first polarity.

* * * * *

UNITED STATES PATENT AND TRADEMARK OFFICE
CERTIFICATE OF CORRECTION

PATENT NO.   : 6,781,147 B2
DATED        : August 24, 2004
INVENTOR(S)  : Chen et al.

It is certified that error appears in the above-identified patent and that said Letters Patent is hereby corrected as shown below:

Column 6,
Lines 36-39, should read as follows:
-- The lateral current blocking LED according to claim 1, wherein the semiconductor layer of the first polarity and the active layer are made of $(Al_xGa_{1-x})_yIn_{1-y}N$ ($0 \leq x \leq 1$; $0 \leq y \leq 1$).

Signed and Sealed this

Thirtieth Day of November, 2004

JON W. DUDAS
*Director of the United States Patent and Trademark Office*